US007646028B2

(12) United States Patent
Russell et al.

(10) Patent No.: US 7,646,028 B2
(45) Date of Patent: Jan. 12, 2010

(54) LED DRIVER WITH INTEGRATED BIAS AND DIMMING CONTROL STORAGE

(75) Inventors: Anthony G. Russell, San Jose, CA (US); Gelu Voicu, San Jose, CA (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 959 days.

(21) Appl. No.: 10/463,979

(22) Filed: Jun. 17, 2003

(65) Prior Publication Data

US 2004/0256625 A1 Dec. 23, 2004

(51) Int. Cl.
*H01L 27/15* (2006.01)

(52) U.S. Cl. .......................... 257/80; 257/84; 257/225; 257/314; 257/E33.001

(58) Field of Classification Search .................. 257/80, 257/93, 368, 431, 444, 446
See application file for complete search history.

(56) References Cited

U.S. PATENT DOCUMENTS 5,278,404 A 1/1994 Yeates
5,349,595 A 9/1994 Ogawa et al.
5,629,635 A 5/1997 Reno
5,663,782 A 9/1997 Saita et al.
5,844,928 A 12/1998 Shasri et al.
5,892,532 A 4/1999 Katakura et al.
5,983,286 A * 11/1999 Pakenham .................... 710/9
6,097,351 A * 8/2000 Nishida ...................... 345/1.3
6,111,522 A * 8/2000 Hiltz et al. ............... 340/932.2
6,255,960 B1 7/2001 Ahne et al.
6,498,616 B1 12/2002 Nagumo et al.
6,778,784 B1 8/2004 Schrodinger
6,819,351 B2 11/2004 O'Hara et al.
6,870,325 B2 3/2005 Bushell et al.
6,943,505 B2 9/2005 Schrodinger
7,148,632 B2 12/2006 Berman et al.
2003/0099147 A1* 5/2003 Deng et al. ............ 365/230.05

OTHER PUBLICATIONS

Toshiba TB62731FU Datasheet, 9 pgs.
Melexis MLX10801 Datasheet, Rev. 015, Mar. 25, 2003, 33 pgs.
Linear Technology LT1932 Datasheet, Linear Technology Corporation, 16 pgs.
Analogic Tech AAT3113/4 Datasheet, 14 pgs.

* cited by examiner

*Primary Examiner*—Wai-Sing Louie
(74) *Attorney, Agent, or Firm*—Bever, Hoffman & Harms, LLP; E. Eric Hoffman

(57) ABSTRACT

A LED driver IC includes a control module(s) for controlling one or more LED drive parameters and non-volatile memory for storing settings data for that control module(s). The control module(s) is fully integrated into the LED driver IC and does not require any control input from off-chip components or signals. Therefore, the space requirements for LED circuits that make use of the LED driver IC can be minimized. Also, the non-volatile memory storage of settings data eliminates the need for an initialization or configuration input each time the LED driver IC is powered on. The non-volatile memory can be a one-time programmable memory or can be a reprogrammable memory.

24 Claims, 6 Drawing Sheets

LED DRIVER WITH INTEGRATED BIAS AND DIMMING CONTROL STORAGE

BACKGROUND OF THE INVENTION

1. Field of the Invention

The invention relates to integrated circuits, and in particular to a light emitting diode driver circuit that includes on-board bias and dimming control settings.

2. Related Art

A light emitting diode (LED) is a diode that emits photons in response to a current flow between its anode and cathode. LEDs are often used in modern lighting applications due to their durability, efficiency, and small size compared to other light sources.

The two main characteristics of LED output are spectral distribution and optical intensity. "Spectral distribution" refers to the distribution of light wavelengths in a particular frequency band of the LED output while "optical intensity" refers to the overall brightness of the LED output. The values of these output characteristics-are controlled by a set of LED drive parameters. For example, the LED drive parameter that controls the spectral distribution of a LED output is bias current (i.e., the current flowing through the LED). Optical intensity can also be controlled by bias current, but since changing the bias current changes the spectral distribution of the LED output, using bias current as a drive parameter for brightness control is often unacceptable.

Therefore, to adjust the optical intensity of a LED while maintaining the desired spectral distribution, pulse width modulation (PWM) is usually employed. PWM involves regulating the bias current through the LED so that the current switches between zero and the optimal bias current. By increasing or decreasing the duty cycle (i.e., the percentage of time a bias current is actually flowing through the LED in a given period) of this switching, the optical intensity of the LED output can be increased or decreased, respectively, without changing the spectral density of the LED output. By cycling at a high enough frequency, visible flickering of the LED output can be avoided.

To properly drive LEDs in modern LED applications, LED driver ICs (integrated circuits) are commonly used. A LED driver IC includes circuitry that allows for accurate control over a desired set of LED drive parameters (e.g., bias current and duty cycle) for a LED or group of LEDs. Note that because LEDs are current controlled devices, voltage is not considered a LED drive parameter. The voltage drop across any given LED or group of LEDs is determined by the LEDs themselves, and cannot actually be controlled by the LED driver IC.

FIG. 1 shows a conventional LED circuit 100 formed on a board 101. LED circuit 100 includes a LED driver IC 103, such as the LINEAR TECHNOLOGY™ LT1932 LED driver IC, which includes an input voltage pin VIN, a switching pin SW, a LED drive pin DRV, a shutdown pin $\overline{\text{SHDN}}$, a current set pin RSET, and a ground pin GND. LED driver IC 103 drives a string of LEDs LS1 via LED drive pin DRV.

To generate the voltage required by LED string LS1, LED driver IC 103 includes switching circuitry that periodically shorts an inductor L1 to ground via switching pin SW. This allows energy (from supply voltage VIN) to be stored in the magnetic field of inductor L1. When the short is removed, the combined voltage from inductor L1 and input voltage VSOURCE charges a capacitor C2 to provide an elevated voltage VBOOST at node A, thereby providing an elevated voltage that satisfies the forward voltage requirements of LED string LS1.

The specific values for the LED drive parameters that are applied to LED string LS1 by LED driver IC 103 are determined by a set of external (i.e., off chip) components, including a resistor R1 and a dimming circuit 102, which are both mounted on a printed circuit board (PCB) 101. For example, the bias current that flows through LED string LS1 is determined by a programming current that flows out of set pin RSET. Resistor R1, which is connected between current set pin RSET and ground, determines the magnitude of this programming current. The higher the resistance of resistor R1, the lower the programming current, and the lower the current flow through LED string LS1.

The optical intensity of the output from LED string LS1 can be adjusted via shutdown pin $\overline{\text{SHDN}}$. A PWM signal PWM_CTRL from dimming logic 102 applied directly to shutdown pin $\overline{\text{SHDN}}$causes LED driver IC 103 to apply the same on/off duty cycle to LED drive pin DRV, thereby pulsing LED string LS1 at the same rate as PWM signal PWM_CTRL. By increasing or decreasing the duty cycle of PWM signal PWM_CTRL the brightness of the output from LED string LS1 can be increased or decreased, respectively.

In this manner, the components of LED circuit 100 that are external to LED driver IC 103 ensure that LED driver IC 103 applies a desired set of LED drive parameter values to LED string LS1. As a result, LED string LS1 is caused to produce a LED output having a desired spectral density and optical intensity.

Note that while different LED driver ICs may use different sets of external components, all conventional LED driver ICs require some type of external circuitry for setting LED drive parameter values. Unfortunately, those external components can complicate the assembly and limit the minimum size of LED circuits that include conventional LED driver ICs.

In an effort to remove some of the size constraints associated with LED driver ICs, the ADVANCED ANALOGIC TECHNOLOGIES™ AAT3113 and AAT3114 LED driver ICs include a bias current module that can be programmed by an external programming signal. However, because the AAT3113/4 LED driver ICs require the external programming signal each time the chip is powered up, the responsiveness of those LED driver ICs is compromised. For example, "instant on" operation is not possible since the AAT3113/4 LED driver ICs must wait for the programming signal before it can provide the desired bias current. Furthermore, the need for a signal source to provide the programming signal (or a control signal such as a PWM signal) can significantly complicate the overall LED circuit design.

Accordingly, it is desirable to provide a LED driver IC that minimizes area requirements and can operate without external control signals or external components.

SUMMARY OF THE INVENTION

According to an embodiment of the invention, a LED driver IC includes at least one non-volatile memory for storing settings data for at least one LED control module in the LED driver IC.

According to another embodiment of the invention, a LED driver IC includes one or more LED control modules and one or more non-volatile memories for storing settings data for the LED control modules. The one or more LED control modules control one or more LED drive parameters at values defined by the settings data stored in the one or more non-volatile memories. Therefore, the one or more LED control modules do not require any external (off-chip) components and/or signals.

According to another embodiment of the invention, a LED circuit includes a LED driver IC and at least one LED. The LED driver IC includes at least one LED control module and a non-volatile memory for storing settings data for the LED control module. The at least one LED control module controls at least one of the LED drive parameters for the at least one LED, based on the settings data stored in the non-volatile memory. According an embodiment of the invention, each LED control module can be associated with a different non-volatile memory. According to various other embodiments of the invention, a single non-volatile memory can include multiple sets of settings data associated with multiple LED drive parameters and/or LED control modules.

By fully integrating non-volatile memory and associated LED drive parameter control logic into a LED driver IC, the invention allows the size of LED circuits incorporating the LED driver IC to be reduced. Furthermore, the non-volatile memory, which stores settings data for the LED drive parameter control module(s), beneficially eliminates the need for any configuration or control inputs to set or manage the behavior of the control logic.

The invention will be more fully understood in view of the following description of the exemplary embodiments and the drawings thereof.

DETAILED DESCRIPTION

Figure 2:
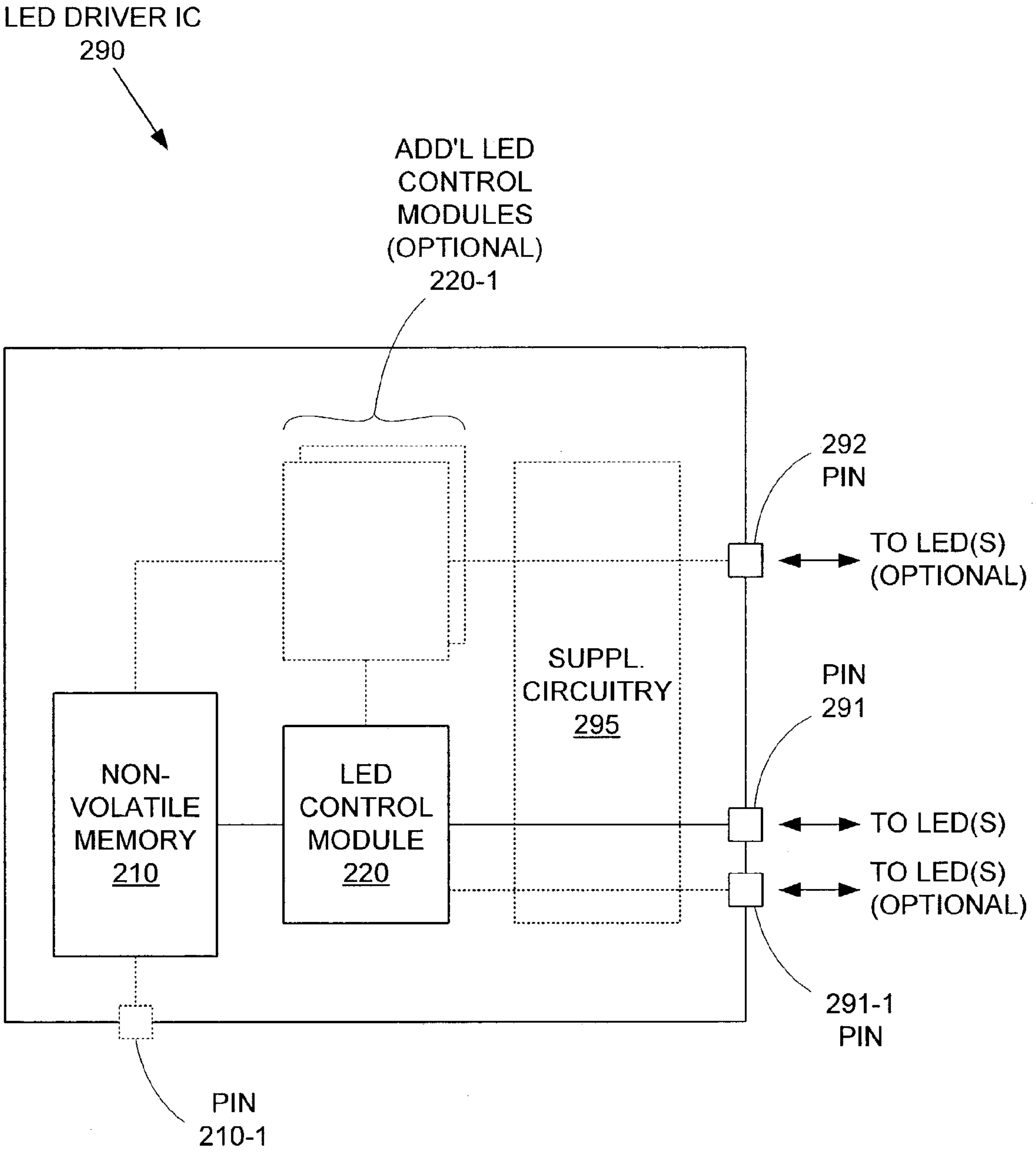
FIG. 2 is a schematic diagram of a LED driver IC incorporating non-volatile settings memory in accordance with an embodiment of the invention.

FIG. 2 shows a LED driver IC 290 in accordance with an embodiment of the invention. LED driver IC 290 includes a LED control module 220 for controlling at least one LED drive parameter, a non-volatile memory 210 for storing settings data for LED control module 220, and pins 210-1, 291, 291-1, and 292.

LED control module 220 manages its associated LED drive parameter(s) (e.g., bias current and duty cycle) based on the settings stored in non-volatile memory 210. These LED drive parameter settings can comprise any type of information for determining the particular value(s) of the LED drive parameter(s) provided by LED control module 220.

For example, LED control module 220 could comprise a bias control circuit for maintaining a bias current through any LEDs coupled to LED driver IC 290, and the specific magnitude of that bias current could be based on a value stored in non-volatile memory 210. Because its settings information is stored in non-volatile memory 210, LED control module 220 does not require any settings input from off-chip components or signals during normal operation, and can therefore by fully integrated into LED driver IC, which reduces the area requirements of any LED circuit incorporating LED driver IC 290.

Figure 1:
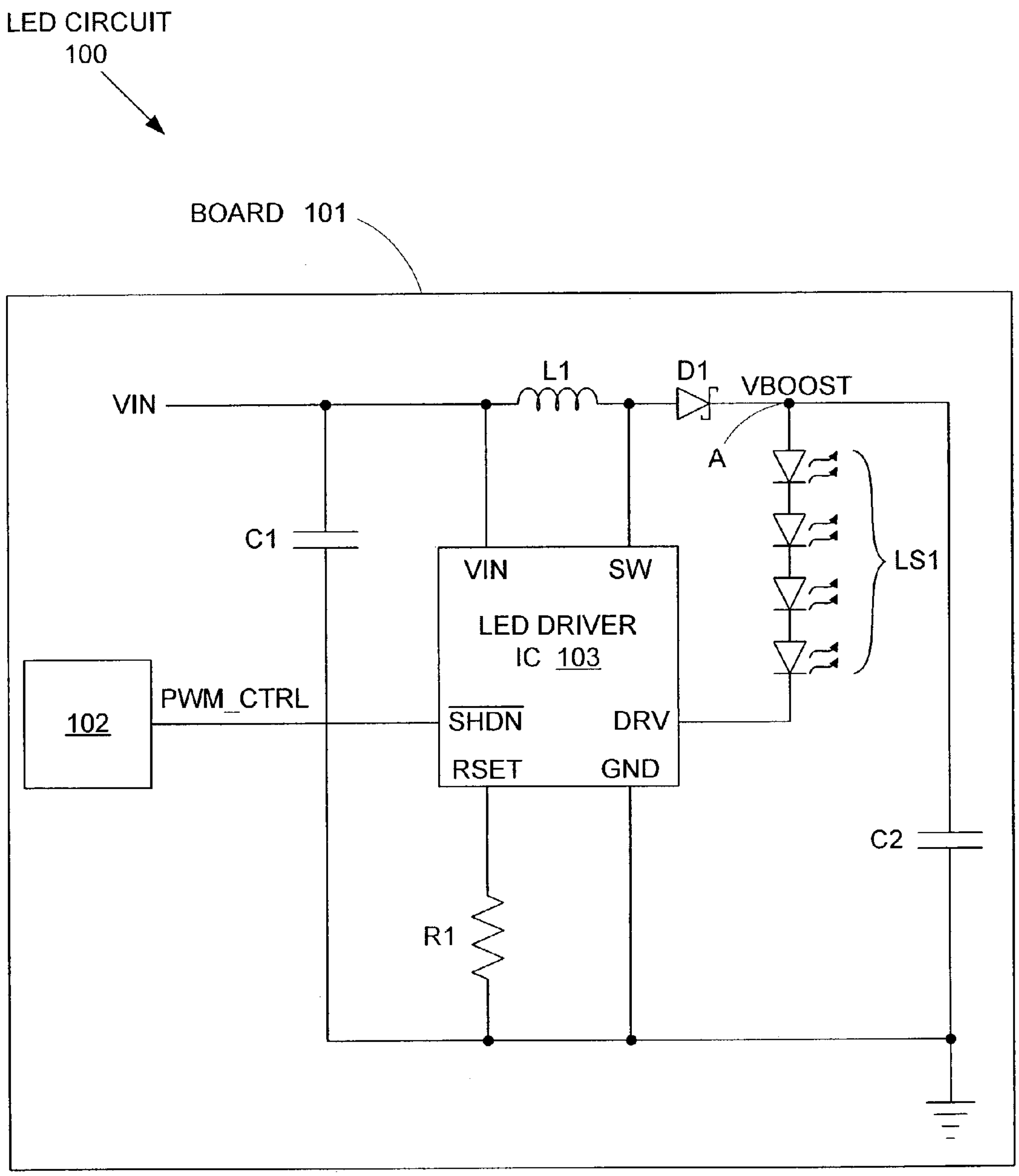
FIG. 1 (PRIOR ART)
FIG. 1 is a schematic diagram of a conventional LED circuit using a conventional LED driver IC.

Note that LED driver IC 290 can include any number of additional LED control modules 220-1 (indicated by the dotted lines) to control additional LED drive parameters (or even additional LEDs). The settings data for those additional LED control modules 220-1 can be stored in non-volatile memory 210 or additional non-volatile memories (not shown for clarity) in LED driver IC 290. This on-chip settings storage beneficially eliminates the need for user control intervention (e.g., dimming circuit 102 in FIG. 1 could be eliminated).

In general, the more LED drive parameter controls that are fully integrated into LED driver IC 290, the smaller a LED circuit using the IC can be. For example, if the fully integrated LED control modules of LED driver IC 290 provide full LED drive parameter control (i.e., control all the LED drive parameters required by a LED), no space need be reserved for external control components (e.g., on a PCB or other mounting location for the LED circuit). For example, various external components shown in FIG. 1 (e.g., resistor R1 and dimming circuit 102) may be eliminated by replacing conventional LED driver IC 103 with LED driver IC 290.

According to an embodiment of the invention, LED control module 220 controls a LED drive parameter(s) for a LED or group of LEDs coupled to pin 291. For example, LED control module 220 could comprise a bias current control circuit for controlling the current flow through any LEDs coupled to pin 291. The specific bias current control circuit could comprise any circuit for maintaining a desired current flow, such as a current mirror or current source. Various other types of bias current control circuits will be readily apparent. The settings data in non-volatile memory 210 would then determine the magnitude of the bias current provided by the bias current control circuit (e.g., by specifying a target bias current or by specifying reference value used by the bias current control circuit in generating the bias current).

Alternatively, LED control module 220 could comprise a brightness control circuit for regulating the optical intensity of any LEDs coupled to pin 291. The specific brightness control circuit could comprise any circuit for brightness adjustment, such as a switched current regulator or a PWM circuit. Various other types of brightness control circuits will be readily apparent. The settings data in non-volatile memory 210 would then determine the amount of adjustment provided by the brightness control circuit (e.g., by specifying a percentage reduction in the average bias current provided to the LEDs or by specifying the duty cycle of the PWM applied to the LEDs).

LED control module 220 could also comprise various other LED drive parameters that can control the behavior of LED(s) connected to pin 291. For example, LED control module 220 could comprise a "current derating" circuit for reducing bias current flow at high operating temperatures to protect the LED(s) being driven by LED driver IC 200. The specific current derating circuit could comprise any current regulation circuit (such as described above) and a temperature sensor. The settings data in non-volatile memory 210 would then determine the particular current derating factor applied by LED control module 220 (e.g., by providing a table of derating factors associated with particular temperatures). Various other configurations for LED control module 220 will be readily apparent.

Note that according to various embodiments of the invention, LED control module 220 can also control LED drive parameter(s) for LED(s) coupled to optional pin 291-1 (e.g., LED driver IC could drive different LED groupings via pins 291 and 291-1). Note further that, while depicted as a single pin for exemplary purposes, optional pin 291-1 can represent any number of additional pins that receive LED drive parameter management from LED control module 220.

As practitioners will appreciate from the above-described examples, the structure and method of operation of LED control module 220 may vary. LED control module 220 has a capability of receiving settings data from non-volatile memory 210 and controlling one or more LED drive parameters for one or more LEDs based on the settings data. The structure of LED control module 220 may include any circuit (e.g., logic circuits or a processor and software) capable of providing LED drive parameter control.

As described above, the specific value(s) for the LED drive parameter(s) provided by LED control module 220 is determined by the settings data stored in non-volatile memory 210. According to an embodiment of the invention, non-volatile memory 210 can comprise any non-volatile memory type, including one-time programmable memory (e.g., read-only memory (ROM) or programmable read-only memory (PROM)) or reprogrammable memory (e.g., erasable programmable read-only memory (EPROM), electrically-erasable programmable read-only memory (EEPROM), or even random access memory (RAM) powered by a battery backup). An optional programming pin or pins 210-1 (indicated by the dotted lines) can provide an interface for programming or reprogramming non-volatile memory 210. Thus, according to various embodiments of the invention, LED driver IC 290 could come pre-programmed from the factory, or could be (re)programmed by a user.

Because non-volatile memory 210 retains its stored settings data even when LED driver IC 290 is powered off, LED control module 220 can begin providing its desired LED drive parameter(s) control immediately after LED driver IC 290 is powered back on (in contrast to those conventional LED driver ICs that require a configuration input signal each time the IC is powered on, such as the AAT3113 and AAT3114 LED driver ICs described above).

According to various embodiments of the invention, instead of being coupled to pin 291 by a direct connection, LED control module 220 can be coupled to pin 291 (and optionally to pins 291-1 and/or 292) by optional supplemental circuitry 295 (indicated by the dotted line). Supplemental circuitry 295 can include any circuitry required in addition to LED control module 220 for controlling (and routing) the desired LED drive parameters, and can even include one or more LEDs to be driven by LED control module 220.

For example, if LED control module 220 comprises a PWM circuit for brightness control, supplemental circuitry 295 could include bias current control circuitry (e.g., a current source or current regulator) for supplying the desired bias current to LEDs coupled to pin 291. LED control module 220 could then cycle the bias control circuitry on and off at a duty cycle determined by settings data stored in non-volatile memory 210 to provide a desired optical intensity from the LED output.

Note that supplemental circuitry 295 need not be fully integrated into LED driver IC 290. For example, if supplemental circuitry 295 includes bias control circuitry, the specific bias current provided by that bias control circuitry could be determined by a resistor external to LED driver IC 290 (similar to resistor R1 described with respect to FIG. 1).

According to various other embodiments of the invention, supplemental circuitry 295 could be connected to pin 292, and LED control module could be connected to pin 291, to drive LED(s) connected between pin 292 and 291. For example, supplemental circuitry 295 could provide a desired bias current for the LEDs, while LED control module 220 could include a switchable ground path that could be enabled and disabled at a duty cycle specified by the settings data stored in non-volatile memory 210 to regulate the brightness of the LED output. Various other arrangements will be readily apparent.

Figure 3A:
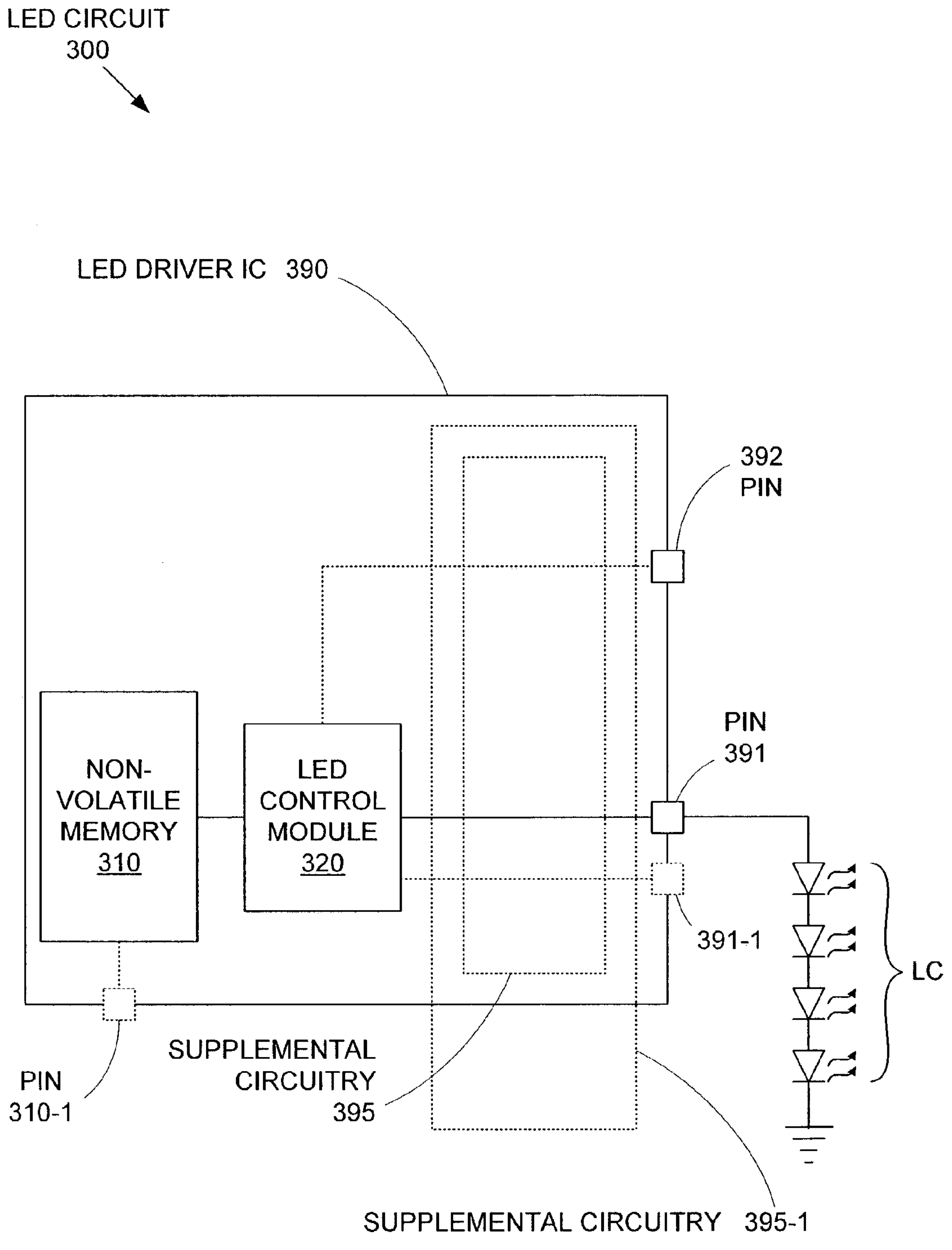
FIG. 3A is a schematic diagram of a LED circuit using a LED driver IC having non-volatile settings memory in accordance with another embodiment of the invention.

FIG. 3A shows a LED circuit 300, according to an embodiment of the invention. LED circuit 300 includes a LED driver IC 390 for driving a LED cluster LC. LED driver IC 390 is substantially similar to LED driver IC 290 shown in FIG. 2, and includes a LED control module 320 and a non-volatile memory 320 for storing settings data for LED control module 320. An optional pin or pins 310-1 can be included to provide a programming interface for non-volatile memory 310. LED control module 320 is coupled to a pin 391 (and optionally to pins 391-1 and 392) either by a direct connection or by optional supplemental circuitry 395. LED control module controls at least one LED drive parameter for LED cluster LC (and any other LEDs coupled to pins 391-1 and 392) based on the settings data stored in non-volatile memory 310.

Optional supplemental circuitry 395 in LED driver IC 390 controls any other LED drive parameters not managed by LED control module 320. As described above, supplemental circuitry 395 may operate in conjunction with external components to provide a desired functionality, as indicated by the dotted outline for supplemental circuitry 395-1 (e.g., supplemental circuitry 395-1 could comprise a bias current control circuit for providing a bias current that is determined by a resistor external to LED driver IC 390 (similar to resistor RI described with respect to FIG. 1)).

LED cluster LC is connected between pin 391 and ground. Note that, while a string of four LEDs are shown for explanatory purposes, LED cluster LC can comprise any number and arrangement of LEDs. For example, LED cluster LC could consist of a single LED, or alternatively could consist of multiple strings of LEDs in parallel.

As described above, LED control module 320 can comprise any circuit for controlling at least one LED drive parameter for LED cluster LC. For example, LED control module 320 could comprise a bias control circuit for controlling the bias current through LED cluster LC, a brightness control circuit for applying PWM (or any other type of brightness adjustment) to the bias current provided to LED cluster LC, a current derating circuit for reducing the bias current at high operating temperatures, or even a combination of multiple different drive control circuits. In each case, the settings data stored in non-volatile memory 310 determines the specific value of the LED drive parameter(s) provided by LED control module 320.

Note that, while LED cluster LC is depicted as being connected between pin 391 and ground for exemplary purposes, various other LED connection configurations can be used depending on the particular functionality and configuration of LED control module 320 (and supplemental circuitry 395/395-1).

Figure 3C:
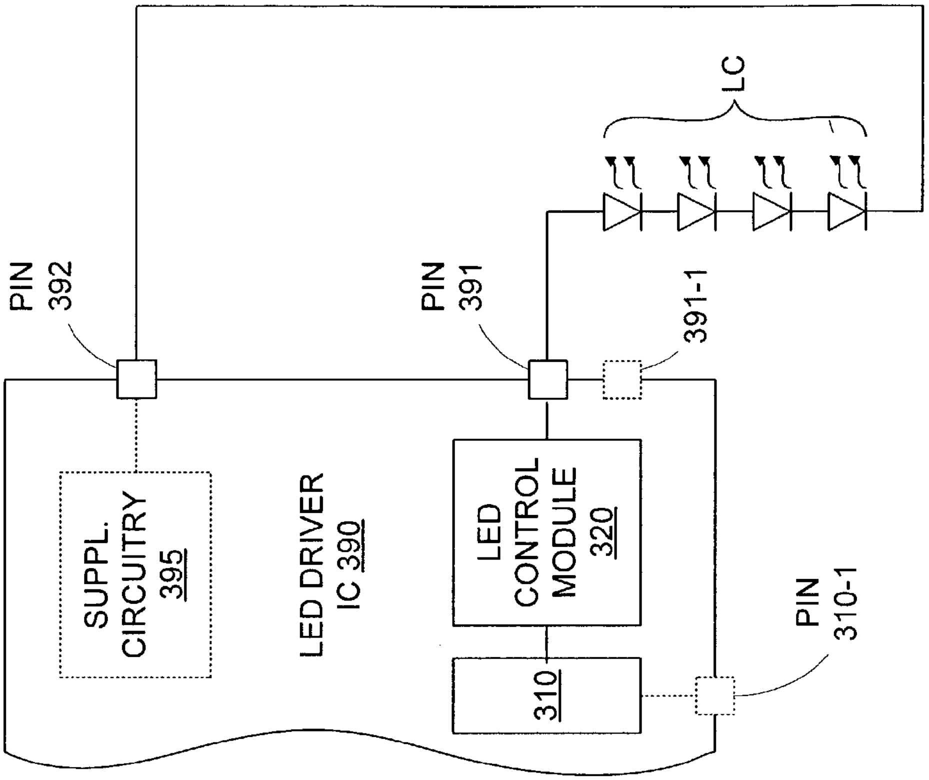
FIGS. 3B-3E are schematic diagrams of various LED connection configurations for the LED circuit of FIG. 3A, according to various embodiments of the invention.
Figure 3B:
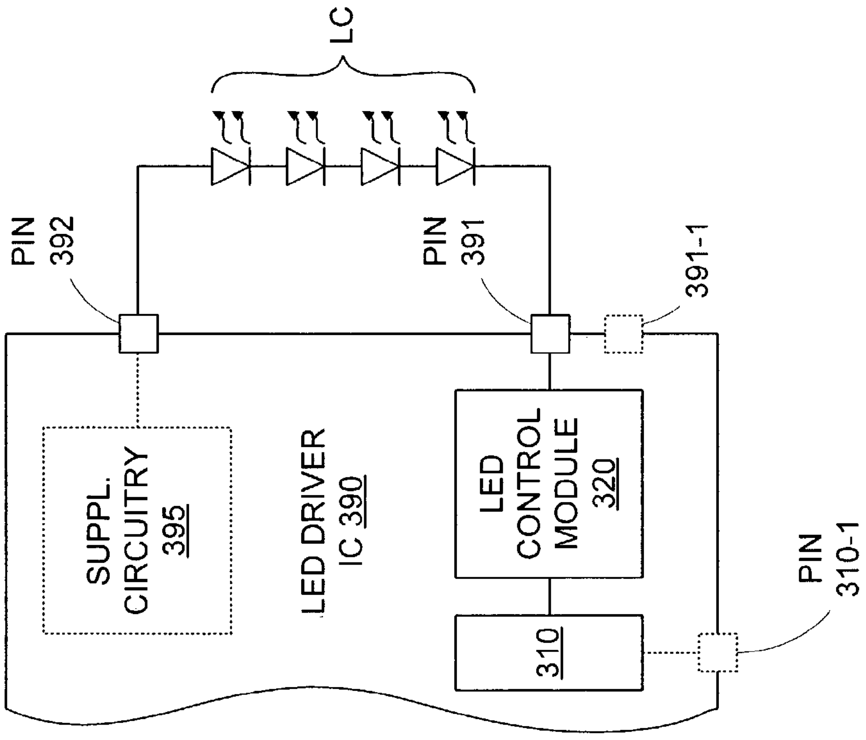

For example, FIG. 3B depicts a detail view of the LED connection region for LED circuit 300, according to an embodiment of the invention. In FIG. 3B, LED cluster LC is connected between pins 392 and 391 of LED driver IC 390. In this configuration, LED control module 320 could provide brightness control and/or bias current control (based on settings data stored in non-volatile memory 310), and supplemental circuitry 395 would control any remaining LED drive parameters required by LED cluster LC (e.g., forward voltage control).

Note that according to another embodiment of the invention, the polarity of LED cluster LC could be reversed between pins 391 and 392, as shown in FIG. 3C. In this configuration, LED control module 320 could control any combination of bias current, forward voltage, and duty cycle (once again, based on settings data stored in non-volatile memory 310).

Note further that supplemental circuitry 395 need not necessarily provide its LED drive parameters via pin 392. For example, FIG. 3D shows another detail view of the LED connection region for LED circuit 300, according to another embodiment of the invention. In FIG. 3D, supplemental circuitry 395 incorporates components that are internal to LED driver IC and components that are external to LED driver IC 390 (as indicated by the dotted outline of supplemental circuitry 395). In FIG. 3D, supplemental circuitry 395 receives a supply voltage VIN and provides an adjusted voltage VADJ to LED cluster LC via a connection external to LED driver IC 390 (for example, using a charging circuit similar to that formed by inductor L1, Schottky diode D1, and capacitor C2 shown in FIG. 1).

Figure 3E:
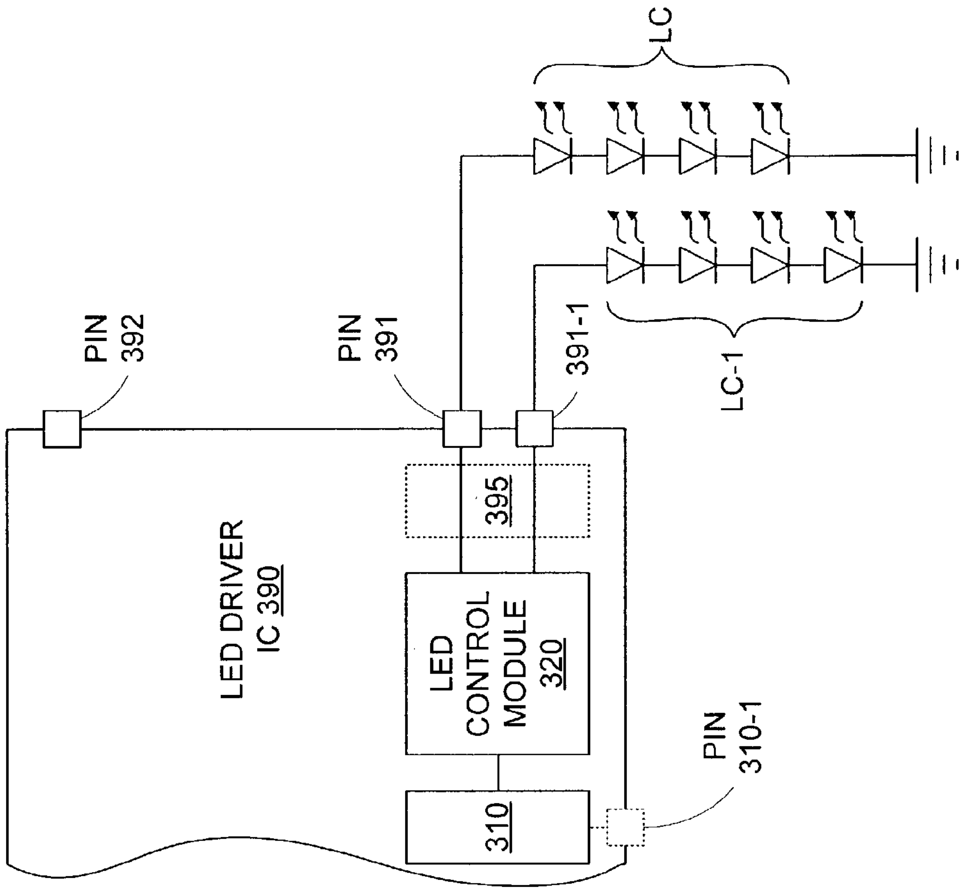
Figure 3D:
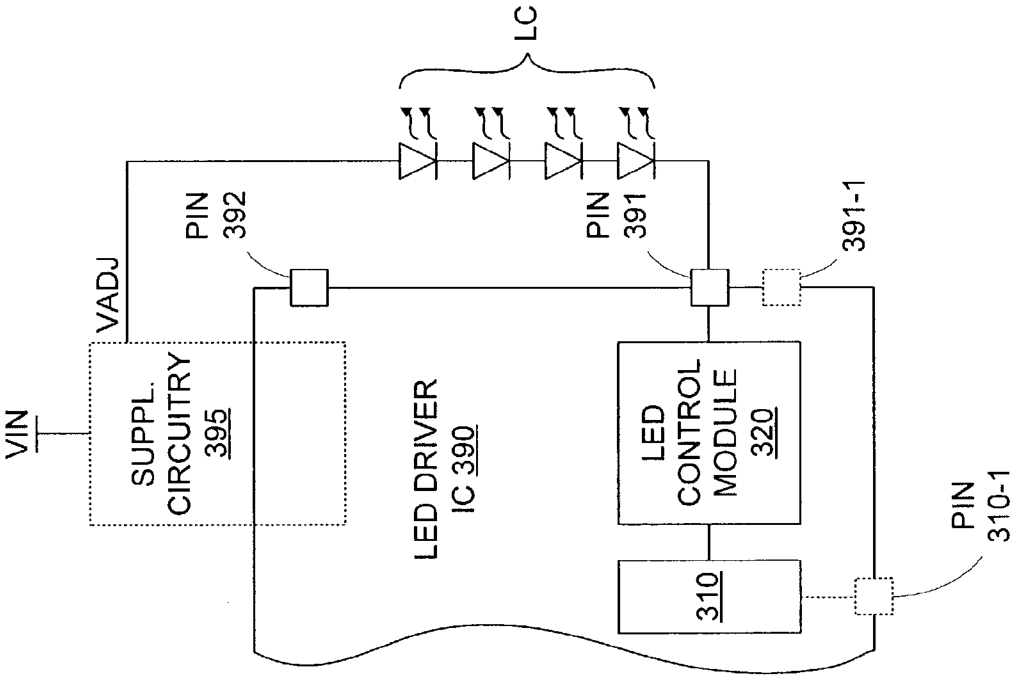

Also, as described above with respect to FIG. 2, LED control module 320 can control LED drive parameters for multiple LED clusters, as shown in FIG. 3E. In FIG. 3E, LED control module 320 is coupled to LED cluster LC via pin 391 and is coupled to LED cluster LC-1 via pin 391-1. Note that while two LED clusters are depicted for exemplary purposes, a single LED control module could be coupled to any number of LED clusters.

The particular LED drive parameter values provided to LED clusters LC and LC-1 by LED control module 320 are determined by the settings data stored in non-volatile memory 310. According to an embodiment of the invention, the settings data can instruct LED control module 320 to provide the same LED drive parameter(s) values to both LED clusters LC and LC-1. According to another embodiment of the invention, the settings data can instruct LED control module 320 to provide different LED drive parameter values to the different LED clusters (for example, if LED clusters LC and LC-1 have different drive or performance requirements). According to another embodiment of the invention, supplemental circuitry 395 could include switching logic to select the pin to which LED drive parameter(s) from LED control module 320 are being applied at any given time.

Figure 4:
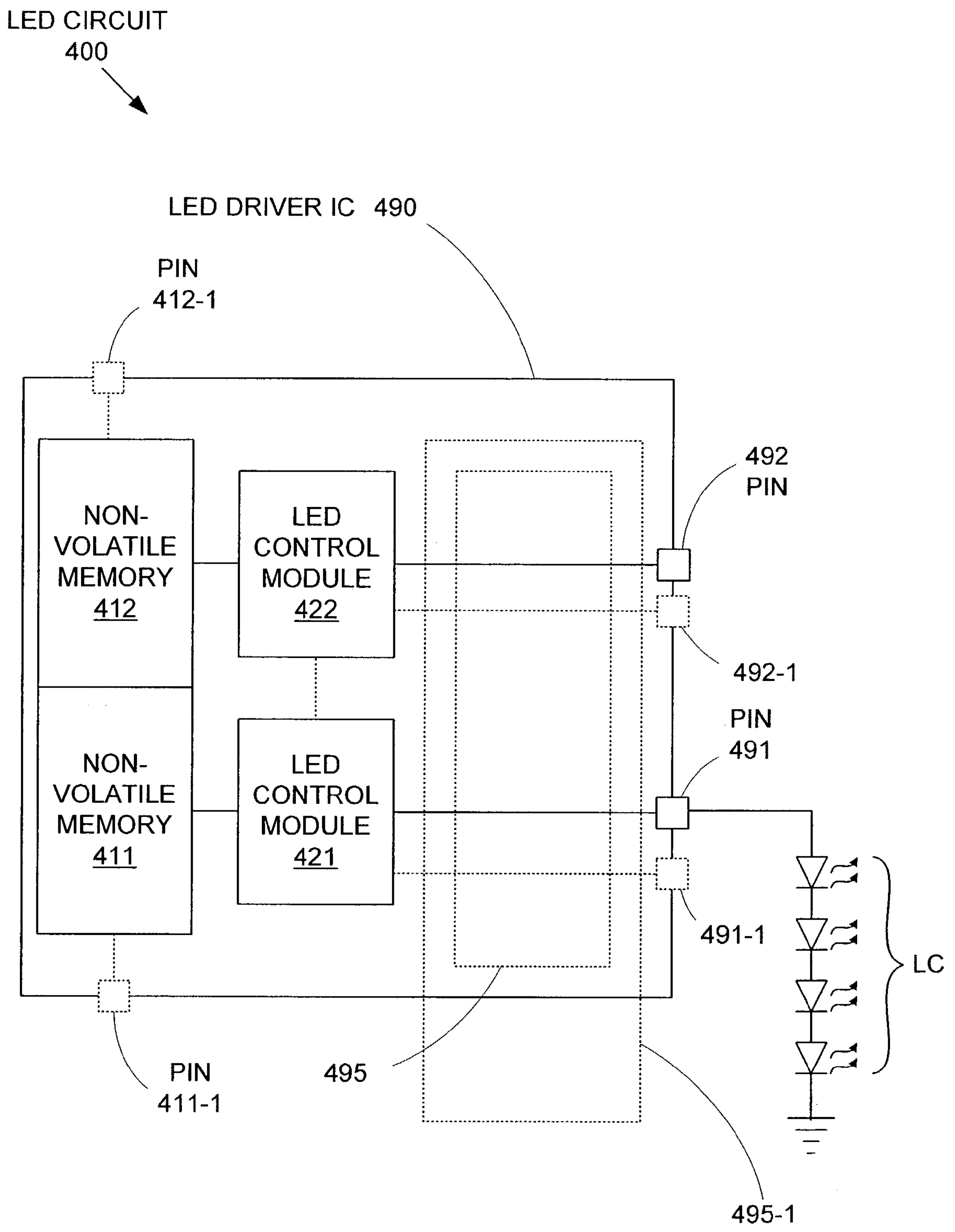
FIG. 4 is a schematic diagram of a LED circuit using a LED driver IC having non-volatile settings memory and fully integrated LED control modules in accordance with another embodiment of the invention.

FIG. 4 shows a LED circuit 400 in accordance with another embodiment of the invention. LED circuit 400 includes a LED driver IC 490 for driving a LED cluster LC. LED driver IC 400 is substantially similar to LED driver IC 390 shown in FIG. 3A, except that LED driver IC 400 includes two LED control modules 421 and 422, which control LED drive parameters for LED cluster LC based on settings data stored in non-volatile memories 411 and 412, respectively. As described above with respect to FIG. 2, such settings data can include bias current values, PWM settings, and current derating factors, among others. Note that while non-volatile memories 411 and 412 are depicted as discrete memories for exemplary purposes, they can alternatively comprise a single memory within LED driver IC 490. According to an embodiment of the invention, optional pins 411-1 and 412-1 can be provided to allow for (re)programming of non-volatile memories 411 and 412, respectively.

LED control modules 421 and 422 can comprise any circuitry for controlling the LED drive parameters required by LED cluster LC. Just as with LED driver IC 390 shown in FIG. 3A, LED control modules 421 and 422 can be coupled to any combination of pins 491, 491-1, 492, and 492-1, either directly or via optional supplemental circuitry 495 or 495-1.

For example, according to an embodiment of the invention, LED control module 422 could comprise a bias control circuit for providing an appropriate bias current to LED cluster LC, with non-volatile memory 412 storing magnitude settings for the bias current. Meanwhile, LED control module 421 could comprise a PWM circuit that "makes and breaks" a connection between LED control module 422 and pin 491 at predetermined intervals to provide a desired optical intensity from LED cluster LC, with non-volatile memory 411 storing the duty cycle settings for LED control module 422.

According to another embodiment of the invention, LED control module 422 could comprise a PWM circuit that "makes and breaks" a connection to an appropriate forward voltage for LED cluster LS while LED control module 421 regulates the bias current through LED cluster LS, with non-volatile memories 412 and 411 storing the appropriate settings data. Various other configurations will be readily apparent.

According to other embodiments of the invention, LED control modules 421 and 422 can comprise other types of circuits for generating other types (and combinations) of LED drive parameters. Also, just as with LED driver IC 390 shown in FIGS. 3B-3E, the specific connection configuration between LED cluster LC (and any other attached LED clusters) will depend on the particular functionality and configuration of LED control modules 421 and 422.

The various embodiments of the structures and methods of this invention that are described above are illustrative only of the principles of this invention and are not intended to limit the scope of the invention to the particular embodiments described. Thus, the invention is limited only by the following claims and their equivalents.

We claim:

1. A light emitting diode (LED) driver integrated circuit (IC) comprising:

a first non-volatile memory for storing a first set of LED drive parameter settings;

a first LED control module coupled to receive the first set of LED drive parameter settings from the first non-volatile memory, wherein the first LED control module further controls a second LED drive parameter, and wherein the first set of LED drive parameter settings further determines a value for the second LED drive parameter.

2. The LED driver IC at claim 1, wherein the first nanvolatile memory comprises a onetime programmable memory.

3. The LED driver IC of claim 1, wherein the first nonvolatile memory comprises a reprogrammable memory.

4. The LED driver IC of claim 1, wherein the first LED control module controls a first LED drive parameter in response to the first set of LED drive parameter settings, wherein the first set of LED drive parameter settings determines a value for the first LED drive parameter.

5. The LED driver IC of claim 4, further comprising a first pin coupled to the first LED control module, wherein the first LED control module provides the first LED drive parameter to the first pin.

6. The LED driver IC of claim 4, further comprising a plurality of pins coupled to the first LED central module, wherein the first LED central module provides the first LED drive parameter to each of the plurality of pins.

7. The LED driver IC of claim 6, wherein the first LED control module provides a different value of the first LED drive parameter to each of the plurality of pins.

8. The LED driver IC of claim 4, further comprising:

a plurality of pins; and switching circuitry coupled between the first LED control module and the plurality of pins, wherein the switching circuitry selects one of the plurality of pins to receive the first LED drive parameter from the first LED control module.

9. The LED driver IC of claim 4, further comprising a second LED control module coupled to receive the first set of LED drive parameter settings from the first nonvolatile memory, wherein the second LED control module controls a second LED drive parameter in response to the first set of LED drive parameter settings, wherein the first set of LED drive parameter settings further determines a value for the second LED drive parameter.

10. The LED driver IC of claim 4, further comprising:
- a second nonvolatile memory for storing a second set of LED drive parameter settings; and
- a second LED control module coupled to receive the second set of LED drive parameter settings from the second nonvolatile memory, wherein the second LED control module controls a second LED drive parameter in response to the second set of LED drive parameter settings, wherein the second set of LED drive parameter settings determines a value for the second LED drive parameter.

11. The LED driver IC of claim 10, further comprising:
- a first pin coupled to the first LED control module, the first LED control module providing the first LED drive parameter to the first pin; and
- a second pin coupled to the second LED control module, the second LED control module providing the second LED drive parameter to the second pin.

12. The LED driver IC of claim 11, wherein full LED drive parameter control is provided by the first LED control module and the second LED control module.

13. The LED driver IC of claim 4, wherein the first LED drive parameter comprises bias current, and wherein the first set of LED drive parameter settings comprises bias current value information.

14. The LED driver IC of claim 4, wherein the first LED drive parameter comprises duty cycle, and wherein the first set of LED drive parameter settings comprises duty cycle value information.

15. The LED driver IC of claim 4, wherein the first LED drive parameter comprises current derating, and wherein the first set of LED drive parameter settings comprises current derating factor information.

16. A light emitting diode (LED) circuit comprising:
- at least one LED; and
- a LED driver integrated circuit (IC) coupled to the at least one LED, the LED driver IC comprising:
  - a first non-volatile memory;
  - a first LED control module coupled to receive settings data from the first non-volatile memory; and
  - a first pin coupled to the first LED control module, the at least one LED being coupled to the first pin, the first LED control module providing a first LED drive parameter to the first pin, wherein the settings data from the first non-volatile memory determines a value for the first LED drive parameter, wherein the first LED control module further provides a second LED drive parameter to the first pin, the settings information from the first non-volatile memory further determining a value for the second LED drive parameter.

17. The LED circuit of claim 16, wherein the first nonvolatile memory comprises a onetime programmable memory.

18. The LED circuit of claim 16, wherein the first nonvolatile memory comprises a reprogrammable memory.

19. The LED circuit of claim 16, wherein the LED driver IC further comprises:
- a second nonvolatile memory; and
- a second LED control module coupled to receive settings data from the second nonvolatile memory, wherein the second LED control module provides a second LED drive parameter to the first pin, and wherein the settings data from the second nonvolatile memory determines a value for the second LED drive parameter.

20. The LED circuit of claim 19, wherein the first LED drive parameter comprises bias current and the settings for the first LED control module comprise bias current value information, and wherein the second LED drive parameter comprises duty cycle and the settings for the second LED control module comprise duty cycle value information.

21. The LED circuit of claim 16, wherein the LED driver IC further comprises:
- a second nonvolatile memory;
- a second LED control module coupled to receive settings data from the second nonvolatile memory; and
- a second pin coupled to the second LED control module, the at least one LED being coupled to the second pin, the second LED control module providing a second LED drive parameter to the second pin, wherein the settings data from the second nonvolatile memory determines a value for the second LED drive parameter.

22. An integrated circuit (IC) comprising:
- a control circuit that controls at least one light emitting diode (LED) drive parameter; and
- a nonvolatile memory coupled to the control circuit, wherein the nonvolatile memory stores settings data, wherein the settings data determines a value for the at least one LED drive parameter.

23. The IC of claim 22, further comprising at least one pin coupled to the control circuit, the control circuit providing the at least one LED drive parameter to the at least one pin.

24. The IC of claim 23, wherein the at least one pin is coupled to at least one LED.

* * * * *

UNITED STATES PATENT AND TRADEMARK OFFICE
CERTIFICATE OF CORRECTION

PATENT NO. : 7,646,028 B2 
APPLICATION NO. : 10/463979
DATED : January 12, 2010
INVENTOR(S) : Anthony G. Russell et al.

It is certified that error appears in the above-identified patent and that said Letters Patent is hereby corrected as shown below:

Column 8, line 32, amend “for storing” to -- that stores --.

Column 8, line 33, insert -- and -- after “settings;”.

Column 8, line 40, amend “at” to -- of --.

Column 8, line 40, amend “nanvola-” to -- non-vola- --.

Column 8, line 41, amend “onetime” to -- one-time --.

Column 8, line 42, amend “nonvola-” to -- non-vola- --.

Column 8, line 55, amend “central” to -- control --.

Column 8, line 56, amend “central” to -- control --.

Column 9, line 3, amend “nonvolatile” to -- non-volatile --.

Column 9, line 10, amend “nonvolatile” to -- non-volatile --.

Column 9, line 14, amend “nonvolatile” to -- non-volatile --.

Column 10, line 1, insert -- in response to the settings data from the first non-volatile memory -- after “pin”.

Column 10, line 8, amend “nonvola-” to -- non-vola- --.

Column 10, line 9, amend “onetime” to -- one-time --.

Column 10, line 10, amend “nonvola-” to -- non-vola- --.

Column 10, line 14, amend “nonvolatile” to -- non-volatile --.

Column 10, line 16, amend “nonvolatile” to -- non-volatile --.

Column 10, line 19, amend “nonvolatile” to -- non-volatile --.

Column 10, line 29, amend “nonvolatile” to -- non-volatile --.

Column 10, line 31, amend “nonvolatile” to -- non-volatile --.

Column 10, line 36, amend "nonvolatile" to -- non-volatile --.

Column 10, line 41, amend "nonvolatile" to -- non-volatile --.

Column 10, line 42, amend "nonvolatile" to -- non-volatile --.

Signed and Sealed this

Twentieth Day of April, 2010

David J. Kappos

David J. Kappos
*Director of the United States Patent and Trademark Office*

UNITED STATES PATENT AND TRADEMARK OFFICE

CERTIFICATE OF CORRECTION

PATENT NO. : 7,646,028 B2
APPLICATION NO. : 10/463979
DATED : January 12, 2010
INVENTOR(S) : Russell et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 315 days.

Signed and Sealed this

Sixteenth Day of November, 2010

David J. Kappos
*Director of the United States Patent and Trademark Office*